(12) United States Patent
Nedovic et al.

(10) Patent No.: US 8,300,753 B2
(45) Date of Patent: Oct. 30, 2012

(54) TRIPLE LOOP CLOCK AND DATA RECOVERY (CDR)

(75) Inventors: Nikola Nedovic, San Jose, CA (US); Nestor Tzartzanis, Redwood City, CA (US); William W. Walker, Los Gatos, CA (US)

(73) Assignee: Fujitsu Limited, Kawasaki-shi (JP)

( * ) Notice: Subject to any disclaimer, the term of this patent is extended or adjusted under 35 U.S.C. 154(b) by 719 days.

(21) Appl. No.: 12/510,160

(22) Filed: Jul. 27, 2009

(65) Prior Publication Data

US 2010/0091925 A1  Apr. 15, 2010

Related U.S. Application Data

(60) Provisional application No. 61/084,430, filed on Jul. 29, 2008.

(51) Int. Cl.
*H04L 7/00* (2006.01)
(52) U.S. Cl. ......... 375/355; 375/354; 375/373; 375/376
(58) Field of Classification Search .................. 375/355, 375/354, 373, 376
See application file for complete search history.

(56) References Cited

U.S. PATENT DOCUMENTS

| | | | |
|---|---|---|---|
| 4,920,278 A | 4/1990 | Nawata | |
| 5,039,889 A | 8/1991 | Janta | |
| 5,343,097 A | 8/1994 | Takeuchi | |
| 6,381,291 B1 | 4/2002 | Yom | |
| 6,426,662 B1 | 7/2002 | Arcus | |
| 6,496,077 B2 | 12/2002 | Ahn | |
| 7,012,474 B2 | 3/2006 | Yen | |
| 7,286,625 B2 | 10/2007 | Lee et al. | |
| 7,420,870 B2 | 9/2008 | Park et al. | |
| 7,444,085 B2 | 10/2008 | Ikeuchi | |
| 7,446,616 B2 | 11/2008 | Lee | |
| 7,489,743 B2 | 2/2009 | Koh et al. | |
| 7,535,271 B2 | 5/2009 | Kizer | |
| 7,679,453 B2 | 3/2010 | Min | |
| 7,737,791 B2 | 6/2010 | Sareen et al. | |
| 7,881,419 B2 | 2/2011 | Shin | |
| 7,924,071 B2 | 4/2011 | Hiraku | |
| 8,058,914 B2 | 11/2011 | Kristensson | |
| 8,138,798 B2 | 3/2012 | Nedovic | |
| 2002/0131539 A1 | 9/2002 | Li et al. | |

(Continued)

FOREIGN PATENT DOCUMENTS

WO  2008/018034  2/2008

OTHER PUBLICATIONS

Office Action for U.S. Appl. No. 12/511,365, Oct. 25, 2011.

(Continued)

*Primary Examiner* — Zewdu Kassa
(74) *Attorney, Agent, or Firm* — Baker Botts L.L.P.

(57) ABSTRACT

In one embodiment, a method includes accessing a reference clock having a reference clock frequency and reference clock phase; generating an output clock having an output clock phase and output clock frequency that is a function of an analog control voltage setting and a frequency gain curve; fixing the analog control voltage setting to a predetermined voltage; selecting one of the frequency gain curves within a predetermined frequency range of the reference clock frequency at the analog control voltage setting; adjusting the analog control voltage setting to adjust the output clock frequency to be within another predetermined frequency range of the reference clock frequency; and adjusting the output clock phase to be within a predetermined phase range of an input data phase of the input data stream.

19 Claims, 5 Drawing Sheets

U.S. PATENT DOCUMENTS

| | | | |
|---|---|---|---|
| 2003/0189464 A1 | 10/2003 | Drapkin et al. |
| 2003/0198105 A1 | 10/2003 | Yamaguchi |
| 2003/0198311 A1 | 10/2003 | Song et al. |
| 2004/0022339 A1 | 2/2004 | Nakao |
| 2006/0208811 A1 | 9/2006 | Lee |
| 2006/0255866 A1 | 11/2006 | Hirai |
| 2007/0006053 A1 | 1/2007 | Otto |
| 2007/0041486 A1 | 2/2007 | Shin |
| 2007/0047972 A1 | 3/2007 | Ikeuchi |
| 2008/0100364 A1 | 5/2008 | Hiraku |
| 2008/0111634 A1 | 5/2008 | Min |
| 2008/0192873 A1 | 8/2008 | Tamura |
| 2008/0260071 A1 | 10/2008 | Sidiropoulos |
| 2008/0309319 A1 | 12/2008 | Herman |
| 2009/0009228 A1 | 1/2009 | Jang |
| 2009/0066423 A1 | 3/2009 | Sareen et al. |
| 2009/0125652 A1 | 5/2009 | Huff |
| 2009/0149149 A1 | 6/2009 | Rujis |
| 2009/0237128 A1 | 9/2009 | Qiao |
| 2010/0085086 A1 | 4/2010 | Nedovic |
| 2010/0086075 A1 | 4/2010 | Parikh |
| 2010/0090723 A1 | 4/2010 | Nedovic |
| 2010/0090733 A1 | 4/2010 | Kristensson |
| 2010/0091927 A1 | 4/2010 | Walker |
| 2010/0104057 A1 | 4/2010 | Nedovic |
| 2010/0119024 A1 | 5/2010 | Shumarayev et al. |
| 2010/0241918 A1 | 9/2010 | Nedovic |

OTHER PUBLICATIONS

Scalable SerDes Framer Interface (SFI-S): Implementation Agreement for Interfaces beyond 40G for Physical Layer Devices, IA# OIF-SFI-S-01.0, Nov. 2008.

Von Bueren, George et al, "5.75 to 44Gb/s Quarter Rate CDR with Data Rate Selection in 90nm Bulk CMOS," 34th European Solid-State Circuits Conference, ESSCIRC, 2008.

Savoj, Jafar et al., "Design of Half-Rate Clock and Data Recovery Circuits for Optical Communication Systems," Proceedings of Design Automation Conference, 2001.

Dally, William et al., "Digital Systems Engineering," Cambridge University Press, Cambridge, UK, 2008.

Office Action for U.S. Appl. No. 12/511,352, Oct. 29, 2010.

Office Action for U.S. Appl. No. 12/510,211, Feb. 10, 2011.

SerDes Framer Interface Level 5 Phase 2 (SFI-5.2): Implementation Agreement for *40Gb/s* Interface for Physical Layer Devices, IA# OIF-SFI5-02.0, Oct. 2, 2006.

Hanumolu, P. K. et al., "A Wide-Tracking Range Clock and Data Recovery Circuit", *IEEE JSSC*, 43:2, Feb. 2008.

Lee, J. et al., "A 40-Gb/s Clock and Data Recovery Circuit in O.18-/-tm CMOS Technology", IEEE Journal of Solid-State Circuits, 38:12, Dec. 2003.

Nedovic, N. et al., "A 40-44Gb/s 3x Oversampling CMOS CDR /1: 16 DEMUX", ISSCC Digest of Technical Papers.

Staszewski, R. B. et al, "All-Digital TX Frequency Synthesizer and Discrete-Time Receiver for Bluetooth Radio in 130-nm CMOS", *IEEE JSSC*, 39:12, Dec. 2004.

Office Action for U.S. Appl. No. 12/510,211, Aug. 23, 2010.

Office Action for U.S. Appl. No. 12/511,340, Sep. 28, 2010.

Nedovic, N., U.S. Appl. No. 13/424,728, USPTO, Patent Application filed Mar. 20, 2012, *Symmetric Phase Detector*.

Nedovic, N., U.S. Appl. No. 12/510,211, USPTO, Amendment after non-final Office Action filed Dec. 2, 2010.

Nedovic, N., U.S. Appl. No. 12/510,211, USPTO, Notice of Appeal and Pre-Brief Appeal filed Jun. 8, 2011.

Nedovic, N., U.S. Appl. No. 12/510,211, USPTO, Appeal Brief filed Sep. 6, 2011.

Nedovic, N., U.S. Appl. No. 12/510,211, USPTO, Examiner's Answer to Appeal Brief dated Nov. 10, 2011.

Nedovic, N., U.S. Appl. No. 12/510,211, USPTO, Reply Brief filed Jan. 9, 2012.

Nedovic, N., U.S. Appl. No. 12/511,340, USPTO, Amendment after non-final Office Action filed Dec. 28, 2010.

Nedovic, N., U.S. Appl. No. 12/511,340, USPTO, Notice of Allowance dated Jan. 19, 2012.

Nedovic, N., U.S. Appl. No. 12/511,352, USPTO, Amendment after non-final Office Action filed Feb. 8, 2011.

Nedovic, N., U.S. Appl. No. 12/511,352, USPTO, Notice of Allowance dated Aug. 23, 2011.

Walker, W.., U.S. Appl. No. 12/511,365, USPTO, Amendment after non-final Office Action filed Jan. 20, 2012.

Walker, W., U.S. Appl. No. 12/511,365, USPTO, Supplemental Amendment to Office Action filed Mar. 5, 2012.

Walker, W., U.S. Appl. No. 12/511,365, USPTO, Non-final Office Action dated Mar. 29, 2012.

Parikh, S., U.S. Appl. No. 12/511,917, USPTO, Non-final Office Action dated May 29, 2012.

Nedovic, N., U.S. Appl. No. 13/424,728, USPTO, Non-final Office Action dated Apr. 26, 2012.

US 8,300,753 B2

TRIPLE LOOP CLOCK AND DATA RECOVERY (CDR)

RELATED APPLICATION

This application claims the benefit, under 35 U.S.C. §119 (e), of U.S. Provisional Patent Application No. 61/084430, entitled Triple Loop Clock and Data Recovery Architecture, filed 29 Jul. 2008.

TECHNICAL FIELD

The present disclosure relates generally to clock and data recovery (CDR) circuits.

BACKGROUND

CDR circuits (or systems) are generally used to sample an incoming data signal, extract the clock from the incoming data signal, and retime the sampled data. A phase-locked loop (PLL) based CDR circuit is a conventional type of CDR circuit that utilizes negative feedback. A PLL circuit responds to both the frequency and the phase of a reference signal, automatically raising or lowering the frequency of a voltage-controlled oscillator (VCO) until it is matched to the reference signal in both frequency and phase. In simpler terms, a PLL compares the phases of two signals and produces an error signal which is proportional or otherwise dependent on the difference between the input phases. The error signal is then low-pass filtered by a loop filter and used to drive the VCO which creates an output clock frequency. The output clock frequency is fed through a frequency divider back to the input of the system, producing a negative feedback loop. If the output clock frequency drifts, the error signal will increase, driving the frequency in the opposite direction so as to reduce the error. Thus the circuit attempts to lock the frequency of the output clock to the frequency at the reference input. The dynamics of the loop are generally determined by the open loop gain and the location of open loop zeroes and poles (predominantly in the loop filter).

Conventional CDR circuits based on a PLL architecture suffer from large jitter of the VCO, coming from both noise generated in the VCO and the noise on the control voltage input to the VCO. A low-gain VCO, desired to reduce this noise, normally compromises the requirement for the total loop gain and the tuning range of the VCO, which is related to the range of data rates that the CDR supports.

DESCRIPTION OF EXAMPLE EMBODIMENTS

Particular embodiments relate to a triple loop CDR architecture. Particular embodiments address the conflict between the generation of VCO noise and the tuning range of the VCO by dividing the VCO control into a digital control portion and an analog control portion. In particular embodiments, the digital control is active only during a digital portion of the frequency acquisition mode in which the CDR attempts to match the VCO clock output from the VCO with the frequency of a reference clock signal and is driven by the digital frequency acquisition loop (first loop). During the time period in which the digital frequency acquisition loop is active, the analog control voltage to the VCO is held constant close to the middle of its operating range (e.g., $V_{DD}/2$). Once the digital frequency acquisition loop converges, the CDR enters the analog portion of the frequency acquisition mode (second loop), in which the digital VCO control is held constant and the analog VCO control is driven by a frequency detector to further reduce the difference between the frequency of the VCO clock output from the VCO and the reference clock signal. Once the analog frequency acquisition loop converges, the CDR enters the phase acquisition mode (third loop), in which it matches phase with the input data bit stream(s) as opposed to the reference clock signal. The CDR enters phase acquisition mode from the analog frequency acquisition mode when the frequency difference between the VCO clock and the reference clock falls below a certain threshold, which is detected by a frequency comparator. While in the phase acquisition mode, if the frequency difference between the VCO clock and the reference clock becomes larger than a threshold, the CDR assumes loss of frequency and/or phase lock and exits the phase acquisition mode and, in an example embodiment, repeats the lock-in sequence from the start (back to the first digital loop). Particular embodiments enable a CDR to operate with small VCO gain thereby reducing the effect of the noise on the control voltage and VCO jitter on the jitter of the recovered clock and the bit error rate (BER).

Herein, reference to a frequency may encompass a rate, and vice versa, where appropriate. As an example and not by way of limitation, a reference clock frequency may be a reference clock rate, and vice versa, where appropriate. As another example, an input data frequency may be an input data rate, and vice versa, where appropriate.

Figure 1:
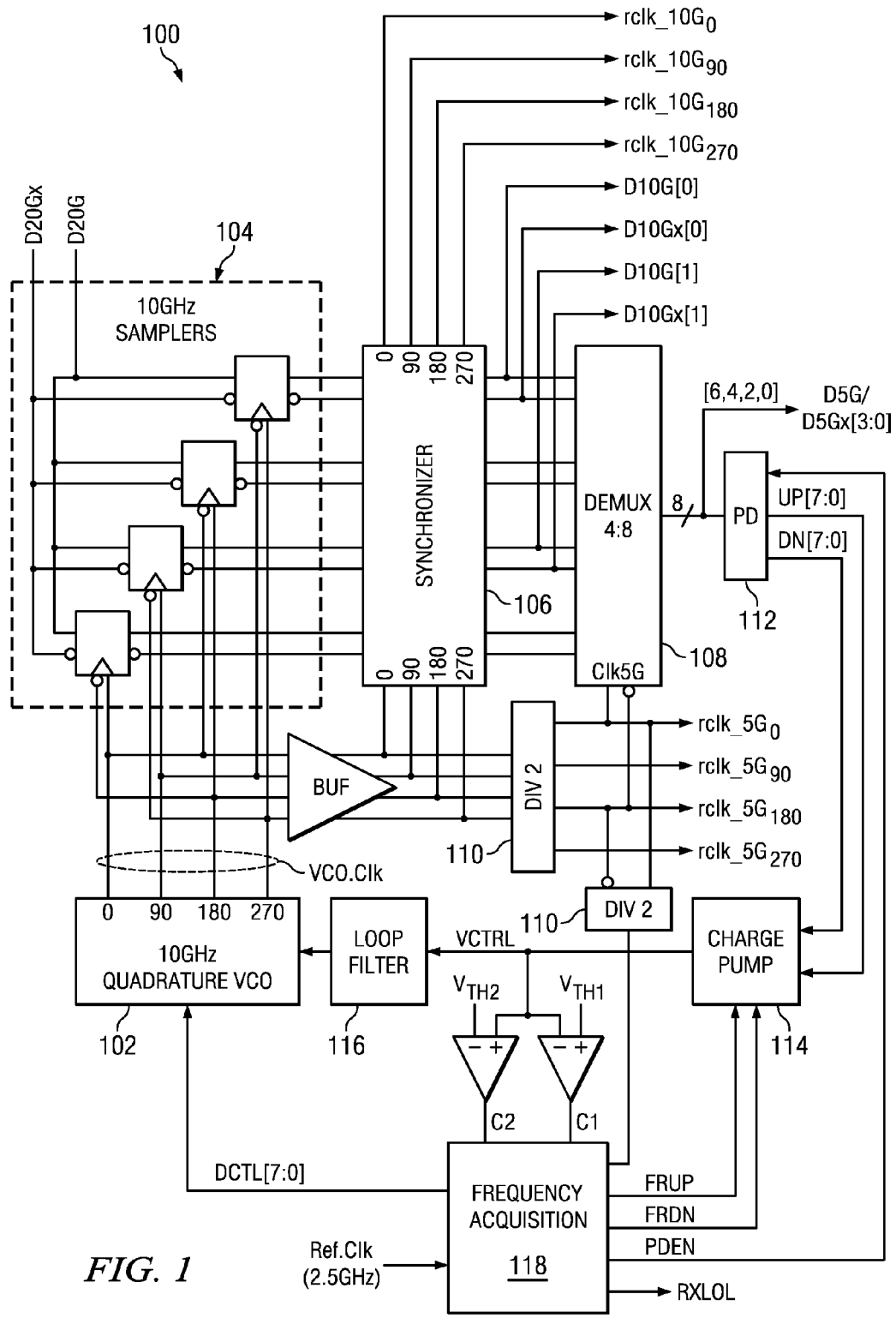
FIG. 1 illustrates an example CDR circuit.

FIG. 1 illustrates an example CDR circuit 100 (CDR 100). In particular embodiments, CDR 100 includes VCO 102, samplers 104, synchronizer 106, demultiplexer (DEMUX) 108, clock dividers 110, phase detector (PD) 112, charge pump (CP) 114, loop filter 116, and frequency acquisition circuit (or block) 118. In a particular example embodiment, VCO 102 is a 10 GHz quadrature VCO based on two coupled LC VCOs and outputs a four phase VCO clock VCO.Clk (e.g., at relative phases of 0°, 90°, 180°, and 270°), samplers 104 include four 10 Gb/s samplers, synchronizer 106 is a 10 Gb/s synchronizer, DEMUX 108 is a 4:8 10 Gb/s to 5 Gb/s DEMUX, clock dividers 110 supply 4-phase 5 GHz clock, and PD 112 and CP 114 operate at 5 Gb/s. In the illustrated embodiment, samplers 104 operate at half data rate and produce four 10 Gb/s sample streams, each synchronous to the VCO phase used to clock the sampler. Synchronizer 106 may serve to synchronize the 10 Gb/s samples to the common reference, which may be, by way of example, VCO phase 0, as well as to generate static 10 Gb/s signals from the outputs of the samplers 104, which may be invalid (reset) half of the cycle. In the illustrated embodiment, the two clock frequency dividers 110 and the DEMUX 108 generate eight 5 Gb/s static CMOS bits from the four 10 Gb/s CML bits from synchronizer 106. PD 112 generates UP and DN signals for CP 114 to adjust the analog control voltage $V_{CTRL}$ generated with loop filter 116 and passed to VCO 102 to raise or lower the frequency of the VCO clock VCO.Clk output from VCO 102, respectively.

Figure 2:
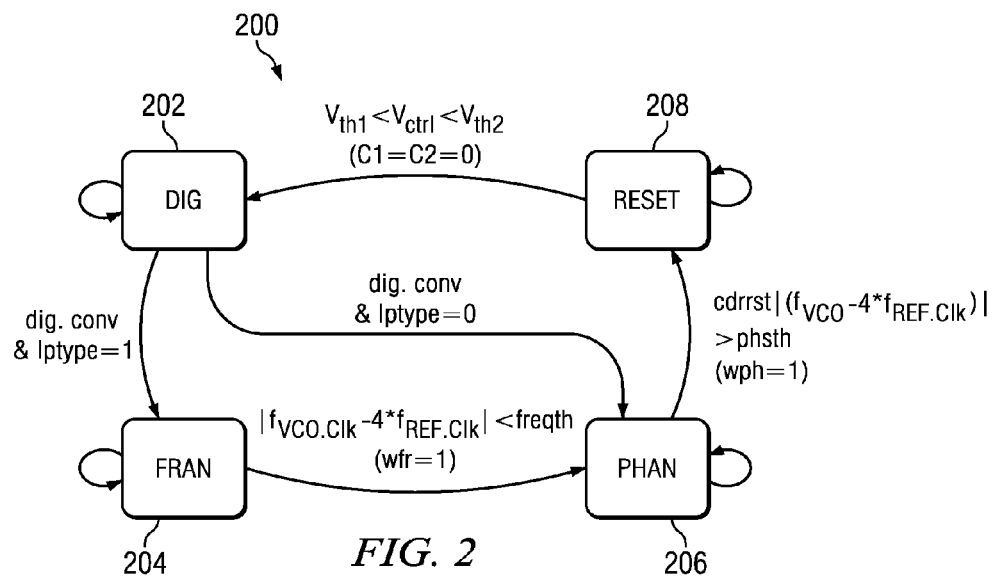
FIG. 2 illustrates example states of a finite state machine.

The three operation modes or loops of CDR 100 (digital frequency acquisition, analog frequency acquisition, and phase acquisition), together with an additional initialization mode may be abstracted as the states of CDR 100 and may be implemented as a finite state machine (FSM). FIG. 2 illustrates example states of an example FSM 200. The current state of FSM 200 defines the current mode of operation of CDR 100 and may generate control signals to other elements of CDR 100 as described in more detail below. In particular embodiments, FSM 200 has four core possible states: the DIG state 202, the FRAN state 204, the PHAN state 206, and the RESET state 208, which determine the mode or loop by which CDR 100 operates, as described in more detail below.

Figure 3:
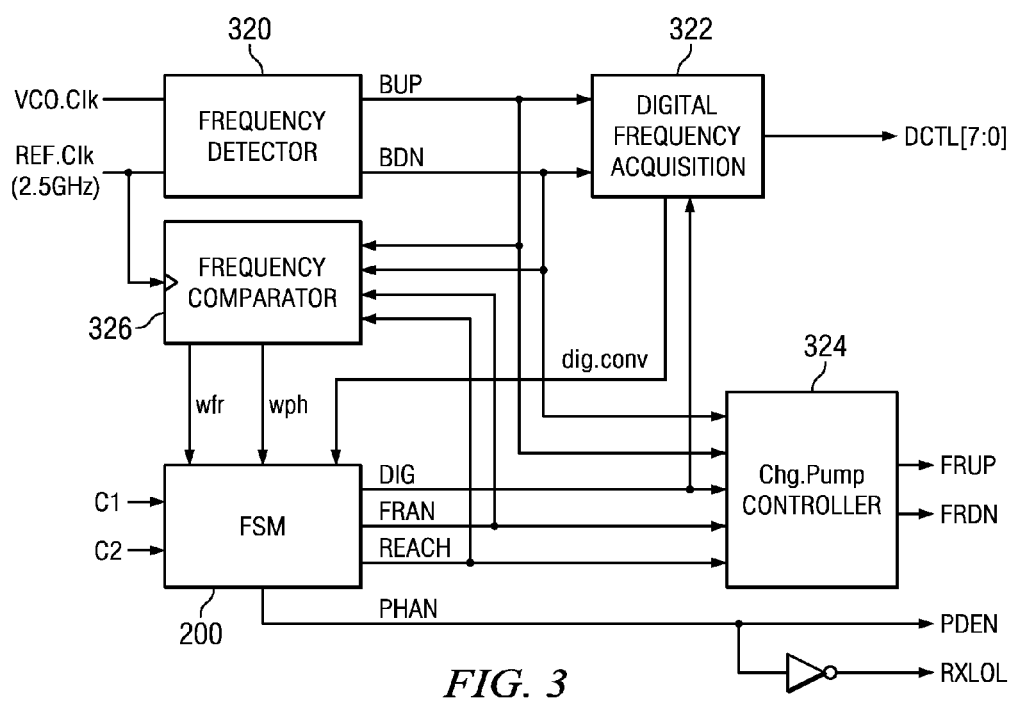
FIG. 3 illustrates an example frequency acquisition circuit.

In particular embodiments, frequency acquisition block 118 receives as input the VCO clock VCO.Clk output from VCO 102, the reference clock Ref.Clk, and the VCO control voltage $V_{CTRL}$, and outputs a digital control signal to VCO 102, which, in the illustrated embodiment, is an 8 bit signal DCTL[7:0], during the digital frequency acquisition, state DIG 202. Frequency acquisition block 118 also outputs control signals FRUP and FRDN to CP 114 which are used to adjust the analog voltage $V_{CTRL}$ to raise and lower the frequency of VCO.Clk output by VCO 102, respectively, during the analog frequency acquisition, state FRAN 204. In the illustrated embodiment, frequency acquisition block 118 further outputs the signal PDEN to PD 112, which enables or disables the phase acquisition loop, state PHAN 206. Frequency acquisition block 118 embodies or contains the finite state machine (FSM) 200 of FIG. 2, a frequency detector 320, a digital frequency acquisition block 322, a charge pump (CP) controller 324, and a frequency comparator 326, as illustrated in FIG. 3, as well as any additional logic required to implement the operations described below.

Frequency detector 320 senses the difference between the frequency of VCO.Clk and the frequency of the reference clock Ref.Clk. Frequency detector 320 asserts the digital signal BUP when VCO.Clk is slower than REF.Clk, and asserts the signal BDN when VCO.Clk is faster than REF.Clk. An example frequency detector is described later in the disclosure with reference to FIGS. 7 and 8.

In the illustrated embodiment, frequency comparator 326 asserts the output wfr if the frequency mismatch between VCO.Clk (divided by four) and REF.Clk is less than an externally defined threshold freqth, and asserts the output wph if the frequency mismatch between VCO.Clk (divided by four) and REF.Clk is less than a larger externally defined threshold, phsth. In one example embodiment, the signal wfr is used to control transition from the FRAN state 204 to the PHAN state 206 and is set to zero during the preceding DIG state 202. In one example embodiment, the signal wph is used to control transition from the PHAN state 206 to the RESET state 208, and is set to zero during the preceding DIG and FRAN states 202 and 204. By way of example, external control bits provided by a configuration control circuit such as an I²C bus can be used to set the values of phths and freqth in order to tighten or loosen the criteria for transitioning between the FRAN, PHAN, and RESET states.

In one example embodiment, digital frequency acquisition block 322 includes two cascaded UP/DN counters (an LSB (least significant bit) counter and a MSB (most significant bit) counter), a sequence detector, and a timer. In one example embodiment, both counters are enabled only in the DIG state 202. The UP and DN outputs of the LSB counter drives the MSB counter, the sequence detector, and the timer. The output of the MSB counter is the digital control code DCTL[7:0] for VCO 102. Prior to operation, the MSB counter may be reset so that VCO 102 starts oscillating at the lowest frequency. The sequence detector and the timer circuits may be used to signal the completion or conversion of the digital frequency loop. This event causes FSM 200 to transition from the DIG state 202 to the FRAN state 204.

In one example embodiment, CP controller 324 generates signals FRUP and FRDN for CP 114 based on the current state of FSM 200, or more generally CDR 100, and the signals BUP, BDN, C1, and C2. For purposes of driving CP 114 in the analog frequency acquisition mode (FRAN state 204), signals BUP and BDN may be implemented using a 3-bit saturation counter. This makes the frequency acquisition loop bang-bang type instead of linear, reducing the sensitivity to the charge pump leakage current and shortening the frequency acquisition time. In a particular example embodiment, the signal FRUP is asserted if the state of the saturation counter is above 3 during the FRAN state 204, or when the input C1 is high (e.g., $V_{CTRL}<V_{TH1}$) in the RESET or DIG states 208 and 202, respectively. In a particular example embodiment, the signal FRDN is asserted if the state of the saturation counter is below 4 during the FRAN state 204, or when the input C2 is high ($V_{CTRL}>V_{TH2}$) in the RESET or DIG states 208 and 202.

The DIG state 202 of FSM 200 represents the digital frequency acquisition loop. While in this state, the phase acquisition loop is disabled, $V_{CTRL}$ is constant, and CDR 100 uses the output of the frequency detector 320 to set the digital control bits DCTL[7:0] to VCO 102. In an example embodiment, an additional control bit, lptype, can be supplied to bypass the FRAN 204 state. When lptype=1, FSM 200 switches from the DIG state 202 to the FRAN state 204 when the condition(s) for convergence of the digital control loop indicated by signal dig.conv have been met, When lptype=0, FSM 200 switches from the DIG state 202 to the PHAN state 206, bypassing the FRAN state 204, when the condition(s) for convergence of the digital control loop indicated by signal dig.conv have been met.

Figure 4:
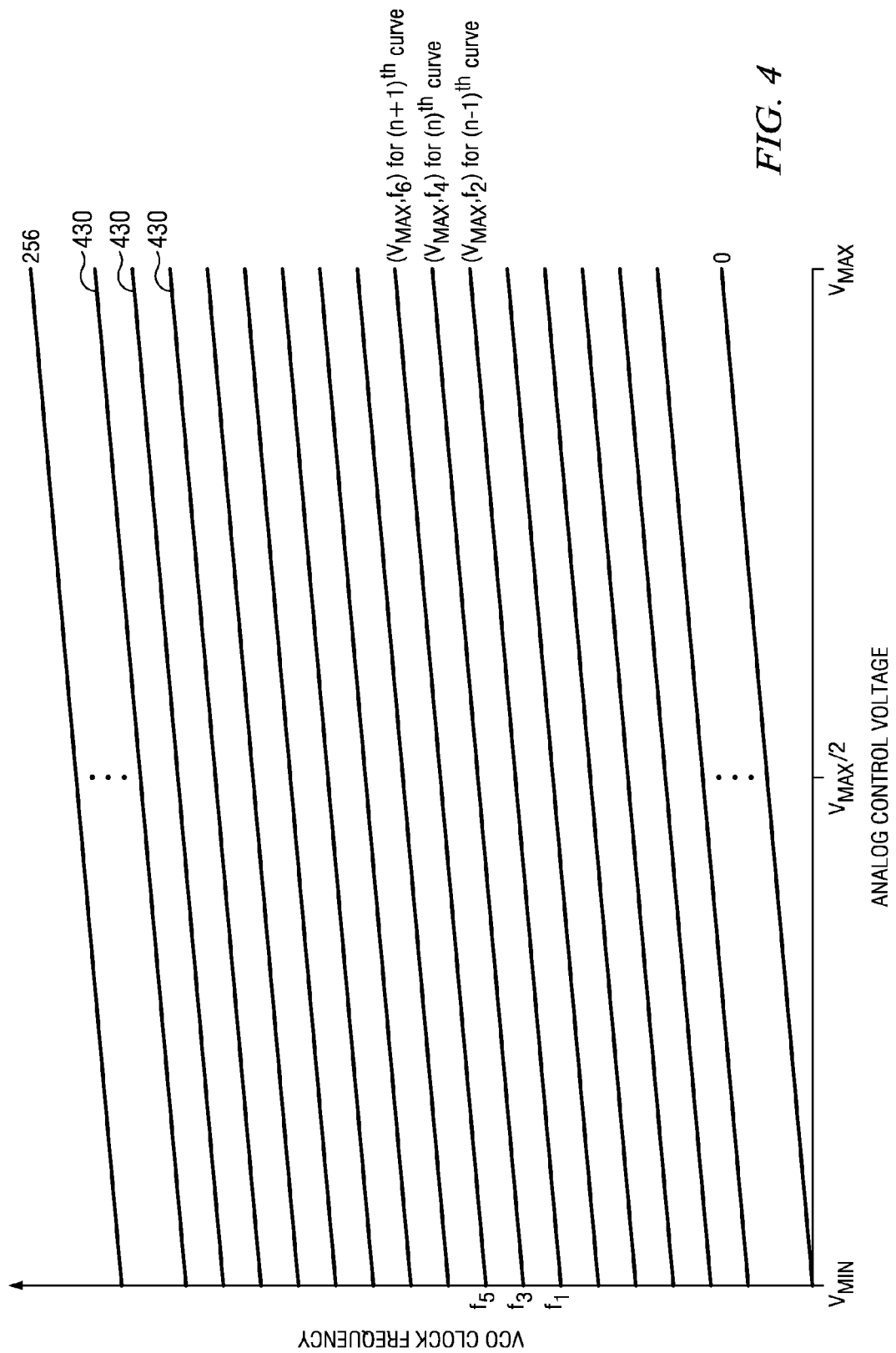
FIG. 4 illustrates example frequency output of a voltage-controlled oscillator as a function of an analog control voltage setting and a selected frequency gain curve.

In particular embodiments, the frequency of VCO.Clk output from VCO 102 is a function of both the analog control voltage setting $V_{CTRL}$ and a frequency gain curve determined through digital VCO control DCTL[7:0] as illustrated in FIG. 4 (the slope of each frequency gain curve represents the gain of VCO 102). In the embodiment illustrated in FIG. 4, the clock frequency of VCO.Clk varies linearly with $V_{CTRL}$, which value may vary from a minimum voltage $V_{MIN}$, which may be, by way of example, 0 V to a maximum voltage $V_{MAX}$, which may be, by way of example, $V_{DD}$. However, the absolute value of the clock frequency of VCO.Clk also depends on the frequency gain curve 430 selected using the digital VCO control DCTL[7:0]. By way of example, if the $(n-1)^{th}$ frequency gain curve 430 is selected, the minimum possible frequency value for VCO.Clk corresponding to $V_{CTRL}=V_{MIN}$ is $f_1$, while the maximum possible frequency value for VCO.Clk corresponding to $V_{CTRL}=V_{MAX}$ is $f_2$. If the $n^{th}$ frequency gain curve 430 is selected, the minimum possible frequency value for VCO.Clk corresponding to $V_{CTRL}=V_{MIN}$ is $f_3$, while the maximum possible frequency value for VCO.Clk corresponding to $V_{CTRL}=V_{MAX}$ is $f_4$. If the $(n+1)^{th}$ frequency gain curve 430 is selected, the minimum possible frequency value for VCO.Clk corresponding to $V_{CTRL}=V_{MIN}$ is $f_5$, while the maximum possible frequency value for VCO.Clk corresponding to $V_{CTRL}=V_{MAX}$ is $f_6$. Depending on the gain of the VCO and the distance between adjacent gain curves 430, the range of possible VCO clock frequencies may overlap between immediately adjacent frequency gain curves in particular embodiments (e.g., $f_2$ is greater than $f_3$). In the illustrated embodiment, there are 256 possible frequency gain curves 430 available for selection corresponding to a digital VCO control DCTL implemented with 8 bits ($2^8$=256). In this way, the frequency of VCO.Clk may be finely tuned while also accommodating a wide range of possible reference clock and input data rate frequencies at low gain, thereby significantly reducing VCO noise.

In a particular embodiment, the digital control DCTL[7:0] is used to increment (or decrement, hereinafter incrementing and decrementing are collectively referred to as incrementing) through the frequency gain curves 430 until VCO.Clk is within a threshold of Ref.Clk. By way of example, at the start of the digital frequency acquisition mode, the digital control DCTL[7:0] may start the incrementing from the particular frequency gain curve 430 selected for the immediately preceding digital frequency acquisition mode. As another example, the digital control DCTL[7:0] may start the incrementing from the lowest possible frequency gain curve 430 available or from any other possible frequency gain curve 430 (e.g., highest possible frequency gain curve or midway (e.g., $128^{th}$) frequency gain curve). During the incrementing, $V_{CTRL}$ is held constant at a midway voltage such as, by way of example, $V_{DD}/2$.

Figure 5:
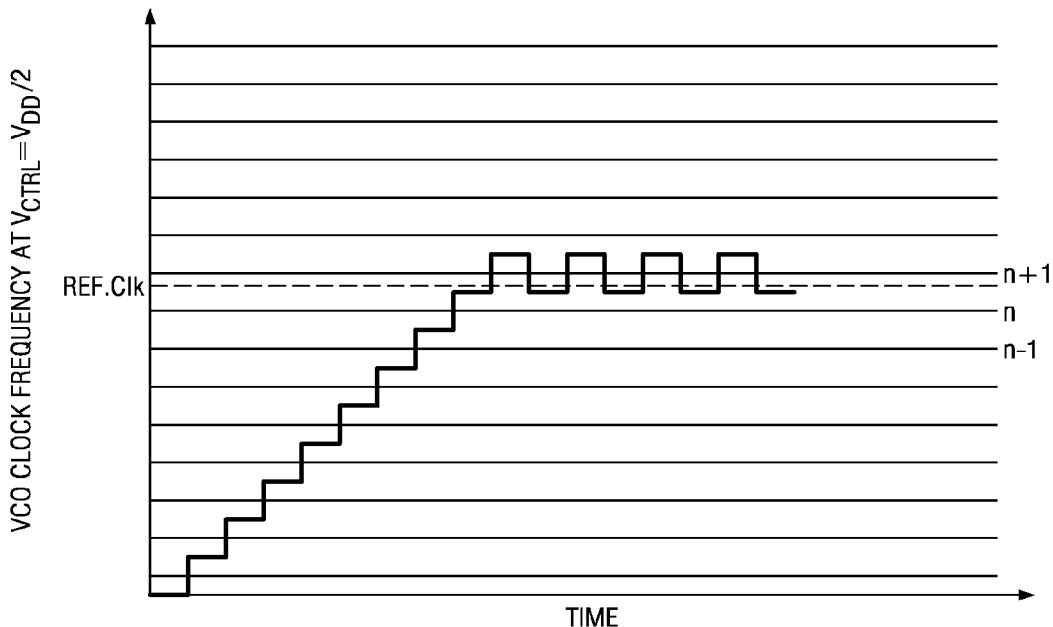
FIG. 5 illustrates example frequency output of a voltage-controlled oscillator versus time for a selected analog control voltage setting during a digital phase acquisition mode.

FIG. 5 shows VCO.Clk frequency versus time for $V_{CTRL}=V_{DD}/2$ during an example incrementing operation. As shown in FIG. 5, by way of example, REF.Clk may be reached via both the $n^{th}$ and $(n+1)^{th}$ frequency gain curves 430 (by adjusting $V_{CTRL}$ up or down relative to $V_{DD}/2$, respectively, while operating in the subsequent analog frequency acquisition loop). In an example embodiment, once the digital control DCTL[7:0] selects the $n^{th}$ frequency gain curve, it may then select the $(n+1)^{th}$ frequency gain curve in an attempt to bring VCO.Clk closer to REF.Clk; however, upon selecting the $(n+1)^{th}$ frequency gain curve, the system will oscillate between the $n^{th}$ and $(n+1)^{th}$ frequency gain curves because the $n^{th}$ curve produces a VCO frequency lower than the REF.clk frequency when $V_{CTRL}=V_{DD}/2$ and the $(n+1)^{th}$ curve produces a VCO frequency higher than the REF.clk frequency when $V_{CTRL}=V_{DD}/2$. Either the $n^{th}$ curve or the $(n+1)^{th}$ curve may be used to reach the REF.Clk frequency in the subsequent FRAN state 204.

In one embodiment, after a predetermined timeout period or after a predetermined number of oscillations have occurred indicating completion or convergence of the digital frequency acquisition loop, one of the two frequency gain curves (n or (n+1)) is selected. By way of example, the condition for convergence may be a toggle back in forth resulting in no change in the digital control code other than oscillating between the $n^{th}$ and $(n+1)^{th}$ frequency gain curves in $2^{16}$ 2.5 GHz cycles (approximately 26 µs). As another example, the condition for convergence may be that the frequency mismatch between VCO.Clk and REF.Clk is less than 200 parts per million (ppm), less than 400 ppm, or less than 800 ppm. In particular embodiments, the gain of each frequency gain curve should be as small as possible to reduce VCO jitter, subject to the constraint that the maximum frequency of the $n^{th}$ curve must exceed the middle frequency of the $(n+1)^{th}$ curve and the minimum frequency of the $(n-1)^{th}$ curve must be lower than the middle frequency of the $n^{th}$ curve. VCO jitter decreases the tolerance of the CDR to data jitter. Furthermore, in particular embodiments, the number of frequency gain curves should be large within limits of memory and implementation to accommodate a wide range of possible reference clock and input data rate frequencies.

In particular embodiments, while operating in the digital frequency acquisition loop, the phase control to the analog control voltage $V_{CTRL}$ through PD 112 and CP 114 is disabled through a signal PDEN that gates the generation of UP and DN signals (which may be implemented with 8 bit control) to CP 114. Additionally, frequency acquisition block 118 updates the digital VCO control DCTL[7:0]. If enabled, such as by setting the external control bit lptype to 1, CDR 100 switches to the analog frequency acquisition loop, FRAN state 204, when the digital control DCTL[7:0] causes VCO.Clk to converge within a predetermined (or predefined) threshold of the reference clock Ref.Clk input to frequency acquisition block 118, which, in the illustrated embodiment, has a frequency of 2.5 GHz. Output dig.conv of the digital frequency acquision block 322 is set to 1 to indicate convergence. In an alternate embodiment, CDR 100 may switch directly to the phase acquisition loop, PHAN state 206. As described above, convergence of the digital frequency acquisition loop may be demonstrated by oscillating between two immediately adjacent frequency gain curves 430. It will be appreciated that the frequency of the reference clock may vary widely in various embodiments according to many factors including, by way of example, the input data rate.

CDR 100 enters the FRAN state 204 after the digital frequency acquisition (DIG state 202) converges and before the phase acquisition loop (PHAN state 206) if the user selectable external control bit lptype is set to 1. In particular embodiments, upon switching to and operating within the FRAN state 204, frequency acquisition block 118 drives the FRUP and FRDN inputs to CP 114 to attempt to further reduce the difference between the frequencies of VCO.Clk and Ref.Clk. More particularly, the value of the VCO digital control code DCTL[7:0] is unchanged and constant and the output of the frequency detector 320 is transmitted to the FRUP and FRDN inputs to CP 114.

In particular embodiments, CDR 100 switches from the FRAN state 204 to the PHAN state 206 when the mismatch between the frequencies of VCO.Clk and Ref.Clk drops below a predetermined (or predefined) frequency threshold freqth, which may be defined by external control bits. By way of example, if two external control bits are used, a value of 00 may indicate that the VCO output frequency is within 50 ppm of the reference clock Ref.Clk, a value of 01 may indicate that the VCO output frequency is within 100 ppm of the reference clock Ref.Clk, a value of 10 may indicate that the VCO output frequency is within 200 ppm of the reference clock Ref.Clk, and a value of 11 may indicate that the VCO output frequency is within 400 ppm of the reference clock Ref.Clk.

In an example embodiment, while in the phase acquisition loop (PHAN state 206), the frequency acquisition circuit 118 is shut off and a phase locking loop circuit comprising samplers 104, DEMUX 108, PD 112, CP 114, loop filter 116, and VCO 102 is activated. In particular embodiments, CDR 100 only performs clock and data recovery while in the phase acquisition loop. In the illustrated embodiment, only while in the phase acquisition loop CDR 100 deasserts the loss of lock signal RXLOL. While operating in the phase acquisition loop, samplers 104 sample input data bit stream D20G/D20Gx (where "x" denotes that this stream is the complement to the true D20G stream, where together, the D20G/D20Gx streams represent the differential input data signal) at an estimated center and edge of each sampled bit using VCO.Clk. After synchronizing the edge and center samples 106, and, in a sample embodiment, demultiplexing to a lower data rate with DEMUX 108 to facilitate implementation of the phase detector in low-frequency circuits, a phase detector, PD 112, compares the center and edge samples to determine whether the VCO.clk frequency must be retarded or advanced in order to center the clock phases in the data eyes.

Each edge to center sample comparator produces either an UP or a DN signal to charge pump 114. In a sample embodiment with PD 112 operating at ¼$^{th}$ the bit rate, 8 up and 8 down signals are produced at each 5 GHz cycle. While in the PHAN state 206, the frequency monitor continues to compare the mismatch between VCO.Clk output by VCO 102 and Ref.clk. In a particular embodiment, if phase lock is lost during the normal phase acquisition loop operation, CDR 100 is forced back to the frequency acquisition loop through another state, the RESET state 208, in which the analog VCO control voltage $V_{CTRL}$ is brought to, by way of example, $V_{DD}/2$. By way of example, FSM 200 may switch from the PHAN state 206 to the RESET state 208 when the mismatch between the frequencies of VCO.Clk and Ref.clk exceeds a frequency threshold phsth determined, for example, by one or more external control bits. By way of example, if two external control bits are used, a value of 00 may indicate that VCO.Clk is within 100 ppm of the Ref.clk, a value of 01 may indicate that VCO.Clk is within 200 ppm of Ref.clk, a value of 10 may indicate that VCO.Clk is within 400 ppm of Ref.clk, and a value of 11 may indicate that VCO.Clk is within 800 ppm of Ref.clk.

In particular embodiments, the RESET state 208 is a transition state between the phase acquisition loop and the digital frequency acquisition loop (PHAN state 206 and DIG state 202), during which the VCO control voltage $V_{CTRL}$ is set to a value near $V_{DD}/2$. The RESET state 208 may also be the state FSM 200 starts with during a reset of CDR 100. While operating in the RESET state 208, CDR 100 compares $V_{CTRL}$ with two threshold voltages, $V_{TH1}$ and $V_{TH2}$, selectable, by way of example, from one or more external control bits. By way of example, if two external control bits are used, a value of 10 may specify a $V_{TH1}$ of 0.25 $V_{DD}$ and a $V_{TH2}$ of 0.75 $V_{DD}$, a value of 11 may specify a $V_{TH1}$ of 0.40 $V_{DD}$ and a $V_{TH2}$ of 0.60 $V_{DD}$, a value of 00 may specify a $V_{TH1}$ of 0.45 $V_{DD}$ and a $V_{TH2}$ of 0.55 $V_{DD}$, and a value of 01 may specify a $V_{TH1}$ of 0.48 $V_{DD}$ and a $V_{TH2}$ of 0.52 $V_{DD}$. The outputs of these frequency comparisons are used to control the FRUP and FRDN signals to CP 114 to bring $V_{CTRL}$ between the comparison thresholds. In a particular embodiment, FSM 200 changes state from RESET to DIG when $V_{TH1} < V_{CTRL} < V_{TH2}$.

Figure 6:
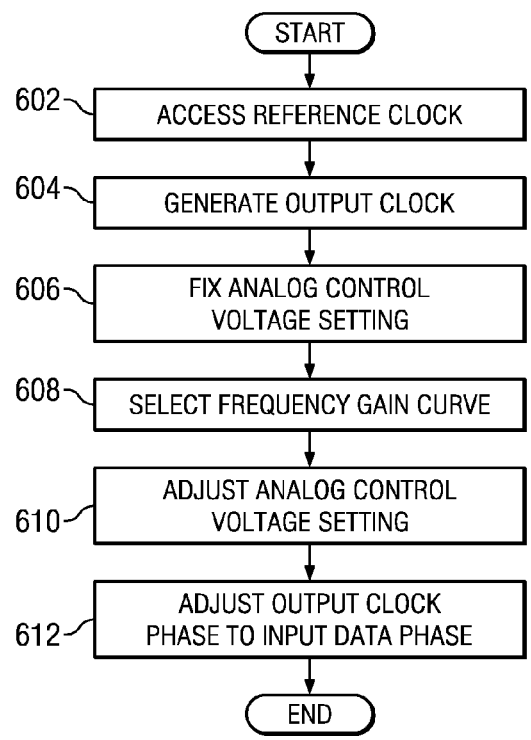
FIG. 6 illustrates an example method for triple loop CDR.

FIG. 6 illustrates an example method for triple loop CDR. The method begins at step 602, where a frequency acquisition block accesses a reference clock having a reference clock frequency and reference clock phase. At step 604, a VCO generates an output clock having an output clock phase and output clock frequency that is a function of an analog control voltage setting and a frequency gain curve. At step 606, the frequency acquisition block fixes the analog control voltage setting to a predetermined voltage. At step 608, the frequency acquisition block selects one of the frequency gain curves within a predetermined frequency range of the reference clock frequency at the analog control voltage setting. The frequency acquisition block then adjusts the analog control voltage setting at step 610 to adjust the output clock frequency to be within another predetermined frequency range of the reference clock frequency. At 612, the PLL circuit adjusts the output clock phase to center the sampling edges in the input data stream eyes, at which point the method ends. Particular embodiments may continuously repeat the steps of the method of FIG. 6, according to particular needs. Although the present disclosure describes and illustrates particular steps of the method of FIG. 6 as occurring in a particular order, the present disclosure contemplates any suitable steps of the method of FIG. 6 occurring in any suitable order. Moreover, although the present disclosure describes and illustrates particular components carrying out particular steps of the method of FIG. 6, the present disclosure contemplates any suitable combination of any suitable components carrying out any suitable steps of the method of FIG. 6.

Figure 7:
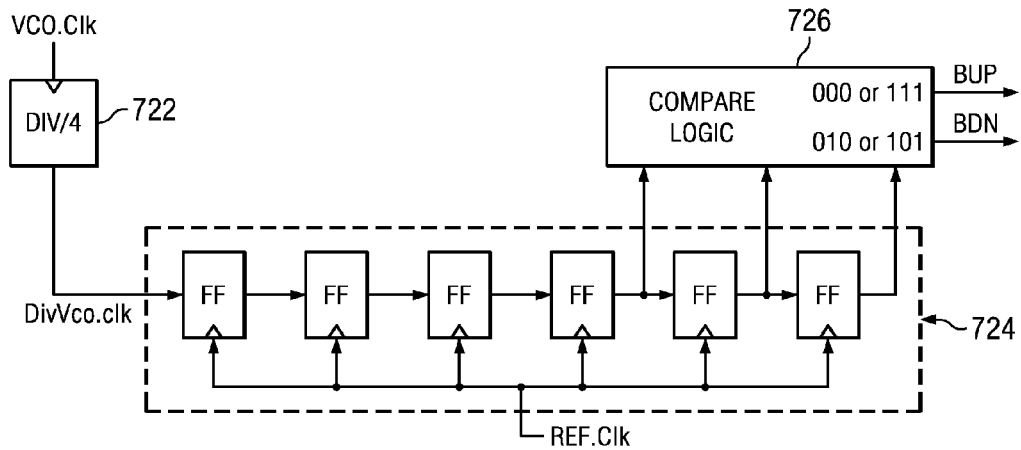
FIG. 7 illustrates an example frequency detector.

Referring now to FIG. 7, an example frequency detector suitable for use in particular embodiments as frequency detector 320 will be described. In particular embodiments, frequency detector 320 is a digital frequency detector that outputs digitals signals with digital levels and fixed duration (cycle time). In particular embodiments, digital frequency detector 320 may be used to drive the digital circuitry that sets the value of the digital VCO control bits for the digital VCO 102 described above. More particularly, in the illustrated embodiment, frequency detector 320 asserts the digital signal BUP when VCO.Clk is slower than REF.Clk, and asserts the signal BDN when VCO.Clk is faster than REF.Clk.

By way of background, as those of skill in the art will appreciate, conventional frequency detectors in CDR circuits and phase locked loops (PLL) typically operate in the analog domain. Even in the conventional frequency detectors that output digital signals, such as a Phase and Frequency Detector (PFD), these frequency detectors carry the phase information in the analog properties of the signal (e.g., pulse width).

FIG. 7 illustrates an example frequency detector circuit 320. In the illustrated embodiment, frequency detector 320 produces a digital signal whose value is indicative of the frequency difference between a VCO clock, VCO.Clk, and a reference clock, REF.Clk, at its inputs. More particularly, frequency detector 320 outputs fully digital signals BUP and BDN, synchronous with the cycle of either of the compared clocks, such that the difference between the number of cycles in which BUP is active (e.g., logical "1") and the number of cycles in which BDN is active (e.g., logical "0") is to a first approximation proportional to the frequency difference between the VCO.Clk and the REF.Clk.

Although the following description focuses on a digital frequency detector 320 in the context of its application in a CDR, such a digital frequency detector has numerous other uses and is not limited to use in a CDR. The principle of operation of the digital frequency detector 320 is based on dividing one of the input clocks and sampling the divided version with the other input clock (using flip-flops clocked using the other clock). By way of example, in the illustrated embodiment, frequency detector 320 includes a clock divider 722, a sampling circuit 724, and compare logic (comparator) 726. In particular embodiments, sampling circuit 724 is implemented with a plurality of flip-flops as shown, by way of example, in FIG. 7. In the illustrated embodiment, VCO.Clk, having a frequency of approximately 2.5 GHz, is input to clock divider 722, which divides VCO.Clk by a divisor of 4 to produce a divided clock DivVCO.Clk, having a frequency of approximately 625 MHz. DivVCO.Clk is then input to a series of flip-flops 724. REF.Clk is also input to the flip-flops 724. In this manner, the divided VCO clock DivVCO.Clk is sampled with the reference clock REF.Clk. The samples are then sent to the compare logic 726, which analyzes patterns in the sequence of samples and produces the signals BUP and BDN.

The number of consecutive samples with the same value indicates the instantaneous frequency difference between DivVCO.Clk and REF.Clk. By way of example, if VCO.Clk is divided by the divisor 4 to produce DivVCO.Clk, and DivVCO.Clk is sampled by the reference clock REF.Clk, then frequency detector 320 will, in the illustrated embodiment, assert BUP (to increase the frequency of VCO.Clk) if it detects a pattern 000 (three consecutive logical zeroes) or a pattern 111 (three consecutive logical ones) in the sequence of samples, and assert BDN (to decrease the frequency of VCO.Clk) if it detects a pattern 101 (one "consecutive" logical zero) or a pattern 010 (one "consecutive" logical one) in the sequence of samples. The difference between the average number of BUP signals and the average number of BDN signals is the indication of the frequency difference between the VCO.Clk and REF.Clk.

Figure 8A:
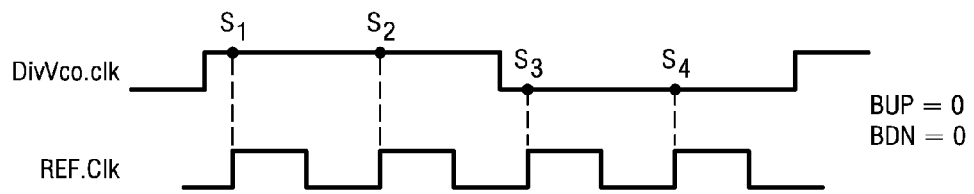
FIGS. 8A-8C illustrate example inputs and outputs to an example frequency detector.
Figure 8B:
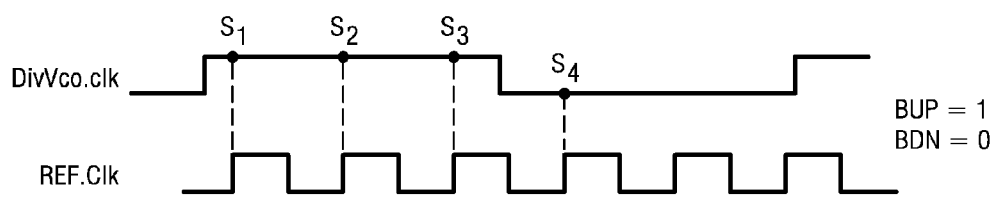
Figure 8C:
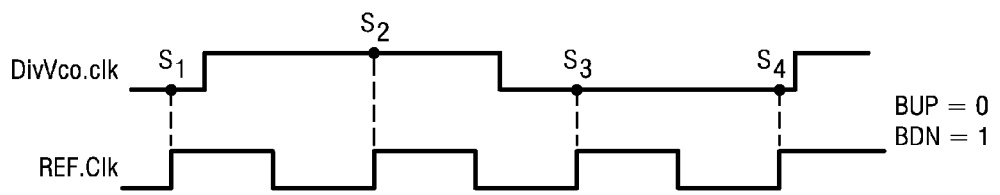

FIGS. 8A-8C illustrate example inputs to frequency detector 320 for DivVCO.Clk and REF.Clk and the example resultant digital outputs BUP and BDN output from frequency detector 320. In FIG. 8A, the value of the frequency (e.g., 625 MHz) of DivVCO.Clk is approximately (to at least a first approximation) equal to one-quarter of the value of the frequency (e.g., 2.5 GHz) of REF.Clk, thus, to a first order approximately, VCO.Clk equals REF.Clk and neither signal BUP or BDN is asserted as frequency detector 320 will detect an alternating pattern of two (half the value of the divisor 4) consecutive logical ones followed by two consecutive logical zeroes in the sequence of samples. In FIG. 8B, the value of the frequency of DivVCO.Clk is too slow, thus the signal BUP will be asserted as frequency detector will detect a pattern 101 (one "consecutive" logical zero) or a pattern 010 (one "consecutive" logical one) in the sequence of samples. In FIG. 8C, the value of the frequency of DivVCO.Clk is too fast, thus the signal BDN will be asserted as frequency detector will detect a pattern 101 (one "consecutive" logical zero) or a pattern 010 (one "consecutive" logical one) in the sequence of samples. It should be noted that the frequencies shown in FIGS. 7 and 8 and the clock divider 722 used are simply examples of possible implementations. Furthermore, where and how the one of the input clocks is divided and sampled may be varied.

The BUP and BDN signals may be used to drive a charge pump as in a conventional analog frequency detector, or they can be digitally filtered and processed further to generate a digital VCO control code as described above, facilitating digital PLL loops. In still other embodiments, the BUP and BDN signals may be used in both ways in different modes of a single CDR. Moreover, other variations of the digital frequency detector are conceivable, including different division ratios and interchanging the VCO clock and the reference clock. Furthermore, the frequency detector may be used to detect the difference between any two clocks, not just a VCO clock and a reference clock. Another embodiment involves a digital integration (arithmetic accumulation) of BUP/BDN signals prior to their use in the other parts of the CDR in order to obtain a nonlinear bang-bang frequency detector.

The present disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend.

The invention claimed is:

1. A method comprising:
at a clock and data recovery (CDR) circuit comprising a digital control circuit and an analog control circuit, accessing a reference clock having a reference clock frequency and a reference clock phase, the reference clock frequency being within a first predetermined frequency range of an input data bit frequency of an input data bit stream;
generating an output clock having an output clock frequency and an output clock phase, the output clock frequency being a function of an analog control voltage setting and a frequency gain curve, there being a plurality of frequency gain curves over a predetermined analog control voltage range that do not intersect;
fixing the analog control voltage setting to a predetermined analog control voltage within the predetermined analog control voltage range;
using the digital control circuit to select one of the frequency gain curves within a second predetermined frequency range of the reference clock frequency at the analog control voltage setting fixed to the predetermined analog control voltage;
using the analog control circuit to adjust the analog control voltage setting from the predetermined analog control voltage to adjust the output clock frequency to be within a third predetermined frequency range of the reference clock frequency, the third predetermined frequency range being smaller than the second predetermined frequency range;
sampling the input data bit stream; and
adjusting the output clock phase to be within a predetermined phase range of an input data bit phase of the input data stream.

2. The method of claim 1, wherein using the digital control circuit to select one of the frequency gain curves within the second predetermined frequency range of the reference clock frequency is independent and not concurrent with using the analog control circuit to adjust the analog control voltage setting from the predetermined analog control voltage to adjust the output clock frequency to be within the third predetermined frequency range of the reference clock frequency, and vice versa.

3. The method of claim 1, wherein using the digital control circuit to select one of the frequency gain curves within the second predetermined frequency range of the reference clock frequency comprises:
comparing the output frequency to the reference clock frequency; and
if the output frequency is less than the reference clock frequency,
selecting a next highest frequency gain curve;
if the output frequency is greater than the reference clock frequency,
selecting a next lowest frequency gain curve.

4. The method of claim 3, further comprising repeating the comparing of the output frequency to the reference clock frequency and the selecting of frequency gain curves until a threshold number of selections are made between two frequency gain curves that are both within the second predetermined frequency range of the reference clock frequency.

5. The method of claim 1, wherein the ranges of possible output frequencies corresponding to any given two immediately adjacent frequency gain curves overlap over at least some possible output frequencies.

6. The method of claim 1, wherein the predetermined analog control voltage is an analog control voltage value that is approximately half of a maximum analog control voltage value.

7. The method of claim 1, wherein using the analog control circuit to adjust the output clock frequency to be within the third predetermined frequency range of the reference clock frequency comprises using the analog control circuit to adjust the output clock frequency to be within the third predetermined frequency range of the reference clock frequency after using the digital control circuit to select one of the frequency gain curves within the second predetermined frequency range of the reference clock frequency.

8. The method of claim 1, wherein adjusting the output clock phase to be within the predetermined phase range of an input data bit phase of the input data stream comprises:
using the output clock to sample input data bits from the input data bit stream; and
phase tracking the sampled input data bits.

9. The method of claim 8, wherein the input data bit stream is sampled at estimated centers of the input data bits and estimated edges of the input data bits.

10. A system comprising:
a voltage controlled oscillator (VCO) configured to generate an output clock having an output clock frequency and an output clock phase, the output clock frequency being a function of an analog control voltage setting and a frequency gain curve, there being a plurality of frequency gain curves over a predetermined analog control voltage range that do not intersect;
a frequency acquisition circuit configured to:
access a reference clock having a reference clock frequency and a reference clock phase, the reference clock frequency being within a first predetermined frequency range of an input data bit frequency of an input data bit stream;
fix the analog control voltage setting to a predetermined analog control voltage within the predetermined analog control voltage range;
select one of the frequency gain curves within a second predetermined frequency range of the reference clock frequency at the analog control voltage setting fixed to the predetermined analog control voltage;
adjust the analog control voltage setting from the predetermined analog control voltage to adjust the output clock frequency to be within a third predetermined frequency range of the reference clock frequency, the third predetermined frequency range being smaller than the second predetermined frequency range; and
a phase-locked loop (PLL) circuit configured to:
sample the input data bit stream; and
adjust the output clock phase to be within a predetermined phase range of an input data bit phase of the input data stream.

11. The system of claim 10, wherein the frequency acquisition circuit is configured to select one of the frequency gain curves within the second predetermined frequency range of the reference clock frequency independently of and not concurrent with adjusting the analog control voltage setting from the predetermined analog control voltage to adjust the output clock frequency to be within the third predetermined frequency range of the reference clock frequency, and vice versa.

12. The system of claim 10, wherein, for the frequency acquisition circuit to select one of the frequency gain curves within the second predetermined frequency range of the reference clock frequency, the frequency acquisition circuit is configured to:
compare the output frequency to the reference clock frequency; and
if the output frequency is less than the reference clock frequency, select a next highest frequency gain curve;
if the output frequency is greater than the reference clock frequency, select a next lowest frequency gain curve.

13. The system of claim 12, wherein the frequency acquisition circuit is configured to repeat the comparing of the output frequency to the reference clock frequency and the selecting of frequency gain curves until a threshold number of selections are made between two frequency gain curves that are both within the second predetermined frequency range of the reference clock frequency.

14. The system of claim 10, wherein the ranges of possible output frequencies corresponding to any given two immediately adjacent frequency gain curves overlap over at least some possible output frequencies.

15. The system of claim 10, wherein the predetermined analog control voltage is an analog control voltage value that is approximately half of a maximum analog control voltage value.

16. The system of claim 10, wherein, to adjust the output clock frequency to be within the third predetermined frequency range of the reference clock frequency, the frequency acquisition circuit is configured to use the analog control circuit to adjust the output clock frequency to be within the third predetermined frequency range of the reference clock frequency after selecting one of the frequency gain curves within the second predetermined frequency range of the reference clock frequency.

17. The system of claim 10, wherein, to adjust the output clock phase to be within the predetermined phase range of an input data bit phase of the input data stream, the PLL circuit is configured to:
use the output clock to sample input data bits from the input data bit stream; and
phase track the sampled input data bits.

18. The system of claim 17, wherein the input data bit stream is sampled at estimated centers of the input data bits and estimated edges of the input data bits.

19. A system comprising:
means for accessing a reference clock having a reference clock frequency and a reference clock phase, the reference clock frequency being within a first predetermined frequency range of an input data bit frequency of an input data bit stream;
means for generating an output clock having an output clock frequency and an output clock phase, the output clock frequency being a function of an analog control voltage setting and a frequency gain curve, there being a plurality of frequency gain curves over a predetermined analog control voltage range that do not intersect;
means for fixing the analog control voltage setting to a predetermined analog control voltage within the predetermined analog control voltage range;
means for selecting one of the frequency gain curves within a second predetermined frequency range of the reference clock frequency at the analog control voltage setting fixed to the predetermined analog control voltage;
means for adjusting the analog control voltage setting from the predetermined analog control voltage to adjust the output clock frequency to be within a third predetermined frequency range of the reference clock frequency, the third predetermined frequency range being smaller than the second predetermined frequency range;
means for sampling the input data bit stream; and
means for adjusting the output clock phase to be within a predetermined phase range of an input data bit phase of the input data stream.

* * * * *